United States Patent [19]

Halfacre et al.

[11] 4,385,947
[45] May 31, 1983

[54] METHOD FOR FABRICATING CMOS IN P SUBSTRATE WITH SINGLE GUARD RING USING LOCAL OXIDATION

[75] Inventors: Mark A. Halfacre, Melbourne; David Shih-Hua Pan, Satellite Beach, both of Fla.

[73] Assignee: Harris Corporation, Melbourne, Fla.

[21] Appl. No.: 287,936

[22] Filed: Jul. 29, 1981

[51] Int. Cl.³ .................... H01L 21/225; B01J 17/00
[52] U.S. Cl. .................................. 148/187; 29/571; 29/576 B; 29/578; 148/1.5; 357/42; 357/91
[58] Field of Search .................. 148/1.5, 187; 29/571, 29/576 B, 578; 357/42, 91

[56] References Cited

U.S. PATENT DOCUMENTS

| | | |
|---|---|---|
| 3,853,633 | 12/1974 | Armstrong . |
| 4,110,899 | 9/1978 | Nagasawa ............................. 29/571 |
| 4,135,954 | 1/1979 | Chang et al. . |
| 4,135,955 | 1/1979 | Gasner et al. . |
| 4,217,149 | 8/1980 | Sawazaki ............................ 148/1.5 |
| 4,224,733 | 9/1980 | Spadea ................................. 29/571 |
| 4,244,752 | 1/1981 | Henderson, Sr. et al. .......... 148/1.5 |
| 4,295,897 | 10/1981 | Tubbs et al. ......................... 148/1.5 |
| 4,314,857 | 2/1982 | Aitken ................................. 148/1.5 |
| 4,325,169 | 4/1982 | Ponder et al. ......................... 29/571 |

Primary Examiner—Upendra Roy

Attorney, Agent, or Firm—Leitner, Palan, Martin and Bernstein

[57] ABSTRACT

CMOS transistors are fabricated in a P substrate by applying a first mask with an opening for introducing N type impurities to form a well, applying a second mask layer of oxidation inhibiting material over the region in which the transistors are to be formed; applying a third mask layer over the well, introducing P type impurities into the surface of the substrate using the second and third masking layers to form a guard ring except in the N− well regions and the regions in which the N channel MOS transistors are to be formed, oxidizing the substrate using said second mask to form a thick oxide layer on said substrate except on the transistor regions with the guard ring vertically displaced from the regions in which the transistors are to be formed, introducing P impurities in the channel region of the CMOS transistors and forming CMOS transistors in said transistor regions.

A CMOS process capable of the fabrication of N and P channel devices with channel lengths down to the submicron region by the proper adjustment of doping levels and implant doses in the N type well and the P and N channel regions, with no major changes in the basic process flow.

16 Claims, 11 Drawing Figures

METHOD FOR FABRICATING CMOS IN P SUBSTRATE WITH SINGLE GUARD RING USING LOCAL OXIDATION

BACKGROUND OF THE INVENTION

The present invention relates generally to integrated circuits and more specifically to an improved method for forming integrated circuits containing complementary field effect transistors in a P substrate.

A process for fabricating high voltage CMOS devices with self-aligned guard rings in an N substrate is described in U.S. Pat. No. 4,135,955 to Gasner et al and assigned to the assignee of the present application. In the Gasner patent, a P conductivity type well is formed in the N substrate and guard rings are provided in the P well as well as in the N substrate using selected diffusion and local oxidation. Although the resulting structure is applicable to many applications, there are certain applications wherein the N channel MOS transistor is required to have higher performance characteristics. Such an N channel device is not capable of being produced using the Gasner process. This is due partially to the segregation phenomenon of N and P type impurities. Also short channel devices may not be formed without modifying the Gasner process which would increase the cost and complexity and possibly reduce device performance. In Gasner, the N channel devices must be built in a P well having a higher impurity concentration than the N substrate which forms the body of the P channel devices.

To form N channel MOS devices in a P substrate using localized oxidation is well known as illustrated in U.S. Pat. No. 3,853,633 to Armstrong. This patent is an example of forming a single N channel device in a P substrate. The application of the process of Armstrong to form a complementary device is illustrated in Armstrong by forming a P well in an N substrate.

The fabrication of CMOS devices in a P substrate is described in U.S. Pat. No. 4,135,954 to Chang et al. The method of fabrication is fairly complicated using five masking layers in combination with other masking layers to produce the appropriate device. The approach of the Chang patent is to provide device isolation using a silicon dioxide barrier with a P+ channel stop. This method is distinct from the guard ring approach of the previously two mentioned patents and requires an extremely deep silicon oxide barrier.

Thus there exists a need for a new process or method of fabricating CMOS transistors in a P substrate which is capable of forming transistors having channel lengths in the micron range.

SUMMARY OF THE INVENTION

An object of the present invention is to provide a method of fabricating CMOS transistors in a P substrate.

Another object of the present invention is to provide a simplified method for fabricating CMOS devices in a P substrate.

An even further object of the present invention is to provide a method of fabricating CMOS devices wherein the performance characteristics of the N channel devices are maximized.

A still further object of the present invention is to provide a simpler method than available in prior art devices to fabricate CMOS transistors in a P substrate with maximized N channel MOS performance characteristics.

A still even further object of the present invention is to provide a method of fabricating CMOS transistors using a single guard ring and local oxidation.

An even further object of the present invention is to provide a method of fabricating CMOS transistors having channel lengths in the micron range.

A still further object of the present invention is to provide a method of fabricating CMOS transistors of any desired length without increasing the number of steps of fabrication.

These and other objects of the invention are attained by applying a first masking layer to a P conductivity type substrate having a thin oxide layer thereon to expose the regions in which the P channel transistor is to be formed. N type impurities are then introduced through the openings to form the N conductivity type well region. The first masking layer is removed and a second masking layer which comprises an oxide inhibiting layer is applied to the substrate and delineated to cover the regions in which the CMOS transistors are to be formed. A third masking layer is applied over the N− well region and P type impurities are introduced to form a guard ring in the surface of the P substrate having a greater impurity concentration than the P substrate and extending along the surface except in the regions into which the N channel MOS device will be formed and in the N− well. The third masking layer is removed and the substrate is oxidized to form a thick oxide layer on the substrate except over the regions in which the transistors will be formed as defined by the second masking layer. This localized oxidation vertically displaces the guard rings from the surface of the transistor regions and partially planarizes the surface. The second masking layer and the oxide layer there below are removed to expose the transistor regions. CMOS transistors are then formed in the exposed regions using self-aligned gate techniques. By forming the N well region with a high surface concentration, the N+ guard ring of the prior art is not needed. This allows higher P+ guard rings to be formed which increase the threshold voltage of a parasitic N channel MOS device.

The above described method of fabrication is capable of forming CMOS transistors having channel lengths in the micron range without increasing the number of steps. The N conductivity type impurities introduced to form the N− well region are selected to be sufficiently high to prevent punchthrough for the desired short channel length of the P channel MOS device. The process for forming the CMOS transistors after localized oxidation generally includes introducing P conductivity type impurities into the N− well to reduce the surface N type impurity concentration and thereby determine the threshold of the P channel MOS device. This process step or a separate step introduces P conductivity type impurities into a surface region of the P type substrate in which the N channel MOS device is to be formed to increase the surface P type impurity concentration and thereby determine the threshold voltage and prevent punchthrough for the desired short channel length of the N channel MOS device.

Other objects, advantages and novel features of the present invention will become apparent from the following detailed description of the invention when considered in conjunction with the accompanying drawings.

DESCRIPTION OF THE PREFERRED EMBODIMENTS

Figure 1:
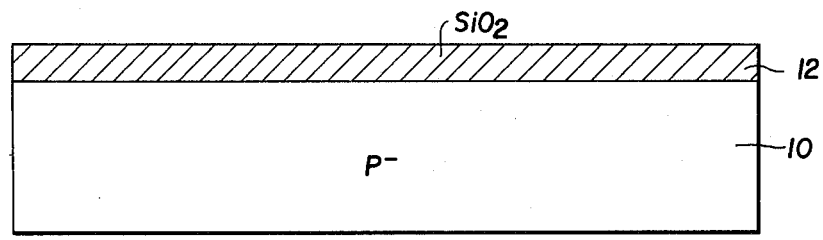
FIGS. 1 through 10 are cross-sectional views of a substrate illustrating the formation of CMOS devices at various stages according to the method of the present invention.
Figure 2:
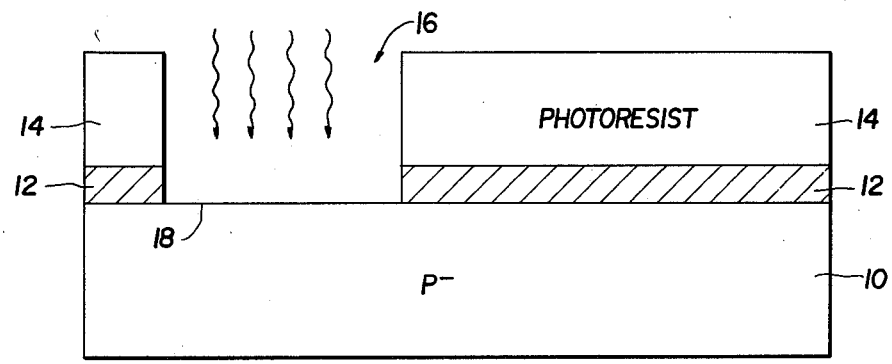
Figure 3:
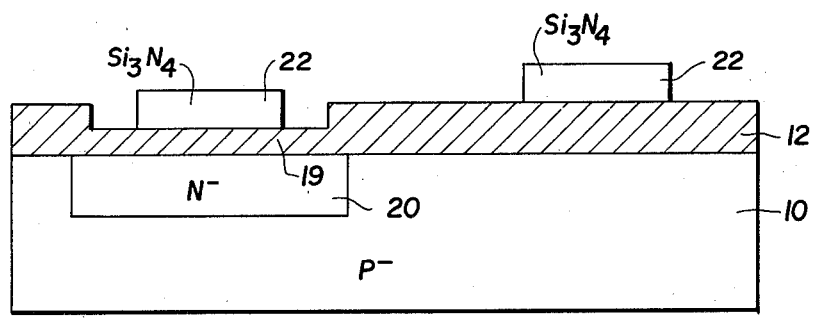

The method of fabricating CMOS devices according to the present invention begins as illustrated in FIG. 1 with a P− type substrate 10 having a relatively thin oxide layer 12 formed thereon. The substrate 10 may have a crystalline orientation of [100], a resistivity of 5–80 ohm-centimeters and an impurity concentration in the range of $1 \times 10^{14}$ to $5 \times 10^{15}$ carriers per cubic centimeter. For a silicon substrate 10, the oxide layer 12 may be silicon dioxide having a thickness of approximately a 1000 angstroms. A first masking layer 14 is applied and delineated to provide an opening 16 in the first mask layer 14 and the oxide layer 12 to expose a surface region 18 of the substrate 10 in which an N conductivity type well will be formed. The masking layer 14 is preferably a photosensitive resist material applied, exposed to the desired pattern, and then etched. N conductivity type impurities, for example, phosphorus are ion implanted into the surface region 18 of the substrate 10 as illustrated in FIG. 2. The N type impurities are then diffused to form an N− well 20 as illustrated in FIG. 3. During the diffusion of the N− well 20, a very thin region of oxide 19 is formed over the well surface 18. Prior to the diffusion process, the photoresist layer 14 is removed.

The surface concentration of the N type impurities in N− well 20 should be in the range of $1 \times 10^{15}$ to $3 \times 10^{16}$ carriers per cubic centimeter. This range is important to prevent punchthrough in N channel MOS devices having short channels. Also, the N type impurity concentration is high enough that a guard ring is unnecessary.

A second masking layer of oxide inhibiting material 22 is applied to the substrate and delineated to form a mask over the regions in which the CMOS transistors are to be formed. As illustrated in FIG. 3, the second mask or oxide inhibiting layer 22 may be silicon nitride and is positioned over the N− well 20 and over a portion of the P− substrate 10. The second masking layer 22 is delineated using a photosensitive resist material and a plasma nitride etch although other methods of delineating the second masking layer may be used.

Figure 4:
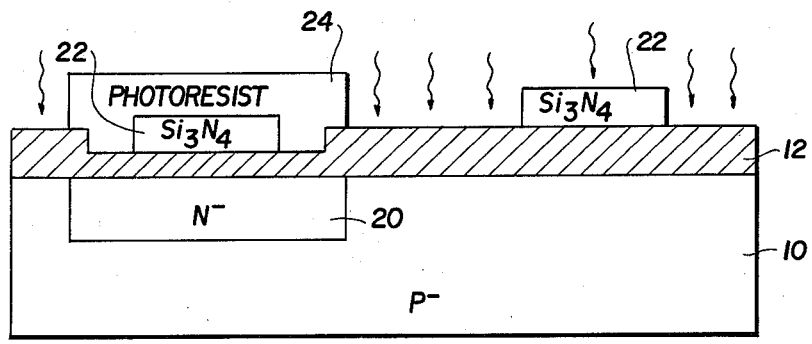

A third masking layer 24 is applied to the substrate and delineated to be above the N− regions 20. As with the first masking layer, the third masking layer 24 may be a photosensitive resist material which is applied, exposed and etched. The resulting structure is illustrated in FIG. 4. P type impurities are then ion implanted to form P+ guard rings at the surface of the substrate 10 except where masked by the third masking layer 24 and those regions masked by the second masking layer 22 in combination with the unetched or original thickness of oxide layer 12. This combination of masking layers and N− well effectively forms a complete guard ring structure for all surface regions of the substrate except those regions in which the transistors are to be formed as defined by the second masking layer 22 and the third masking layer 24. It should be noted that the original oxide thickness 12 in combination with the second masking layer 22 is sufficient to mask the surface regions of the substrate. The third masking layer 24 must be provided above the N− well to provide sufficient masking of the P type impurities. The third masking layer 24 is then removed.

Figure 5:
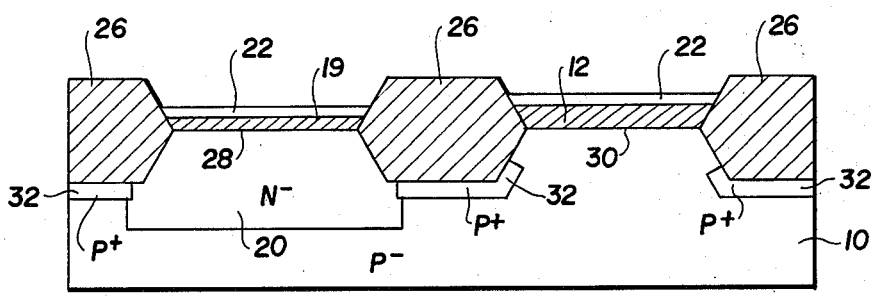

The substrate is then exposed to an oxidizing atmosphere to grow field oxide at all the surfaces of the substrate 10 except those masked with the second silicon nitride masking layer 22. As illustrated in FIG. 5, the thin oxide layer 12 is grown into the substrate 10 as well as above the substrate to form a field oxide layer 26, to partially planarize the surface, and to vertically isolate the transistor surface regions 28 and 30 from the substrate N− well region 20 and P+ guard rings 32. This also allows better step coverage and improved definition of subsequent levels. The field oxide layer 26 is formed to be sufficiently thick to mask the subsequent diffusions forming the source and drain regions in the surface areas 28 and 30. At this stage of the process, the field oxide 26 has an approximate depth of about 8000 angstroms and the N− well 20 a depth of approximately 3.5 to 4 microns.

Figure 7:
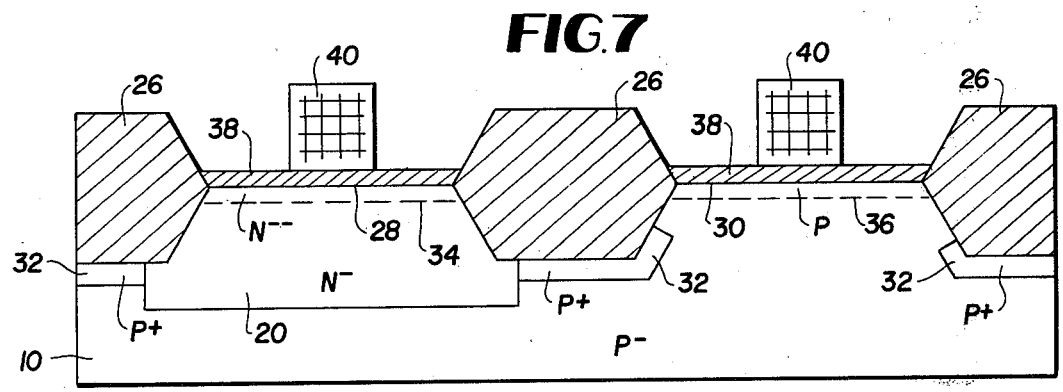
Figure 8:
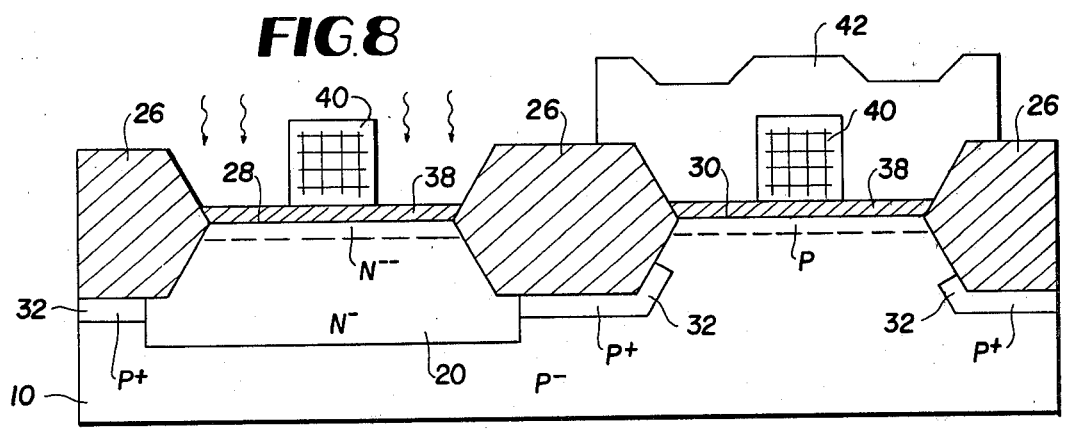

The second masking or silicon nitride layer 22 and remaining portions of oxide layers 12 and 19 thereunder are stripped to expose to the substrate surface regions 28 and 30. P type impurities, for example, boron are then ion implanted into the surface regions 28 and 30. This implantation is a channel-adjust doping operation used to determine the threshold voltage of the P channel MOS transistor and the N channel MOS transistor to be formed in surface regions 28 and 30, respectively, and acts as a channel stopper for the N channel MOS transistor to be formed in surface region 30. The channel-adjust doping merely reduces the N impurity concentration of the surface region 28. The resulting ion implantation regions as illustrated in FIG. 7 as an N−− region 34 in the N− well 20 and a P region 36 in the P− substrate 10. It should be noted that the notation of N−− and P are used to show relative doping levels and the actual impurity levels are selected for specific threshold voltages.

The resulting impurity concentration of the N−− region 34 is in the range of $-7 \times 10^{16}$ to $2.5 \times 10^{16}$ carriers per cubic centimeter and the resulting impurity concentration of the P region 36 is in the range of $5 \times 10^{15}$ to $1 \times 10^{17}$ carriers per centimeter. If the threshold voltages of the two MOS devices cannot be achieved by a single channel adjust doping step, P conductivity type impurities may be introduced using two doping steps, one for the P channel MOS device to be formed in surface region 28 and one for the N channel MOS transistor to be formed in surface region 30.

CMOS transistors are then formed in the surface region 28 and 30 using a self-aligning gate technique similar to that described in U.S. Pat. No. 4,075,754 to Cook and assigned to the assignee of the present application. The Cook patent is incorporated herein by reference. Gate oxide layer 38 is formed on the surfaces 28 and 30 followed by the application of the gate material 40 which is applied and delineated. Preferably the gate material is a polycrystalline silicon having a thickness of approximately 3000–6000 angstroms and the gate oxide has a thickness of approximately 100–500 angstroms. The thickness of the polycrystalline layer 40 is selected to be an effective mask against the impurities to be implanted to form the source and drain regions of the MOS transistors. It should be noted that the polycrystalline layer 40 may be doped with N type impurities to reduce the resistance thereof prior to delineation.

Figure 9:
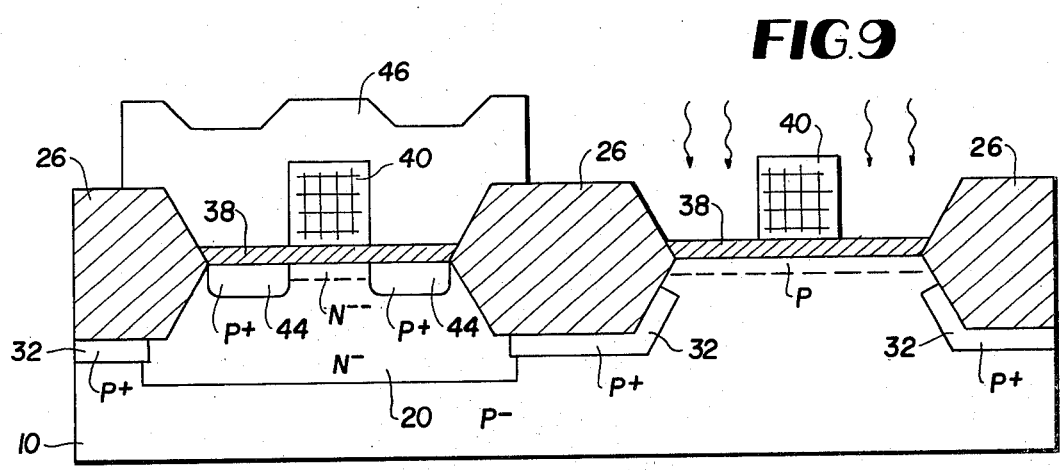

Next the masking layer 42 is provided over the surface area 30 to protect the surface region 30 from the ion implantation used to form the source and drain of the P channel transistor. Masking layer 42 may be a photosensitive resist material, CVD oxide or aluminum. P type impurities, for example, boron are ion implanted into the surface 28 using the field oxide 26 and the gate material 40 as alignment masks. This results in P+ source and drain regions 44 aligned with the gate and the field oxide as illustrated in FIG. 9. This reduces the gate to source-drain capacitance.

Figure 10:
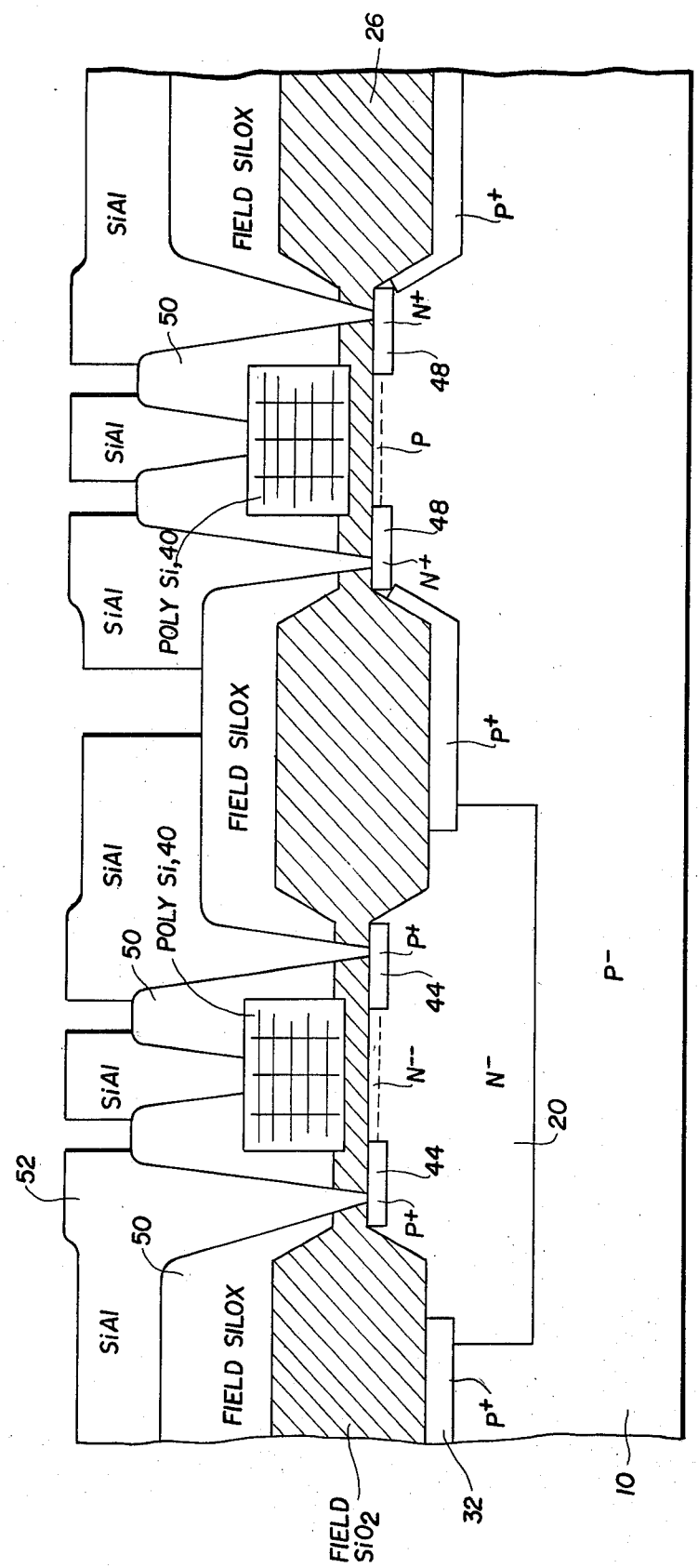

The masking layer 42 is removed and a masking layer 46 is applied over the surface region 28 to mask the P channel transistor during formation of the N channel transistor. N type impurities, for example, phosphorus are introduced to form source and drain regions using the field oxide 26, masking layer 46, and the exposed gate structure 40 as masks. As in the previous transistor formation, the field oxide 26 and the gate material 40 acts as an alignment mask to reduce gate to source-drain capacitance. The resulting sources and drains 48 are illustrated in FIG. 10.

Masking layer 46 is removed and the substrate is covered with a dielectric layer 50 of silox. Apertures are provided in the silox and the contact and interconnect layer is applied and delineated to form contacts and interconnects. As illustrated in FIG. 10, the contact and interconnect layer 52 may be silicon doped aluminum.

It should be noted that the counterdoping step modifies the surface regions or channel regions of the transistors between the source and drain regions and has no effect on the portion of the body relative to the guard rings. Since the N− well is formed in the P− substrate, the N− well has a higher impurity concentration than the P− substrate. Consequently N+ guard rings are not needed to isolate the P+ source and drain regions of the P channel device from the P+ guard rings of the N channel device. By eliminating one series of process steps to form the N+ guard ring, the overall timing cycle and distribution of impurities is reduced. This provides a more controlled CMOS device than prior art methods. The N− well 20 in which the P channel transistor is built is more easily controlled than the P− well formed in a N− substrate because of the difference in the segregation effects of the two types of impurities. Also by using a P− substrate, the N channel MOS transistors' performance is maximized since the P− substrate has a lower concentration than a P− well which must be formed in an N− substrate of other patents.

Figure 11:
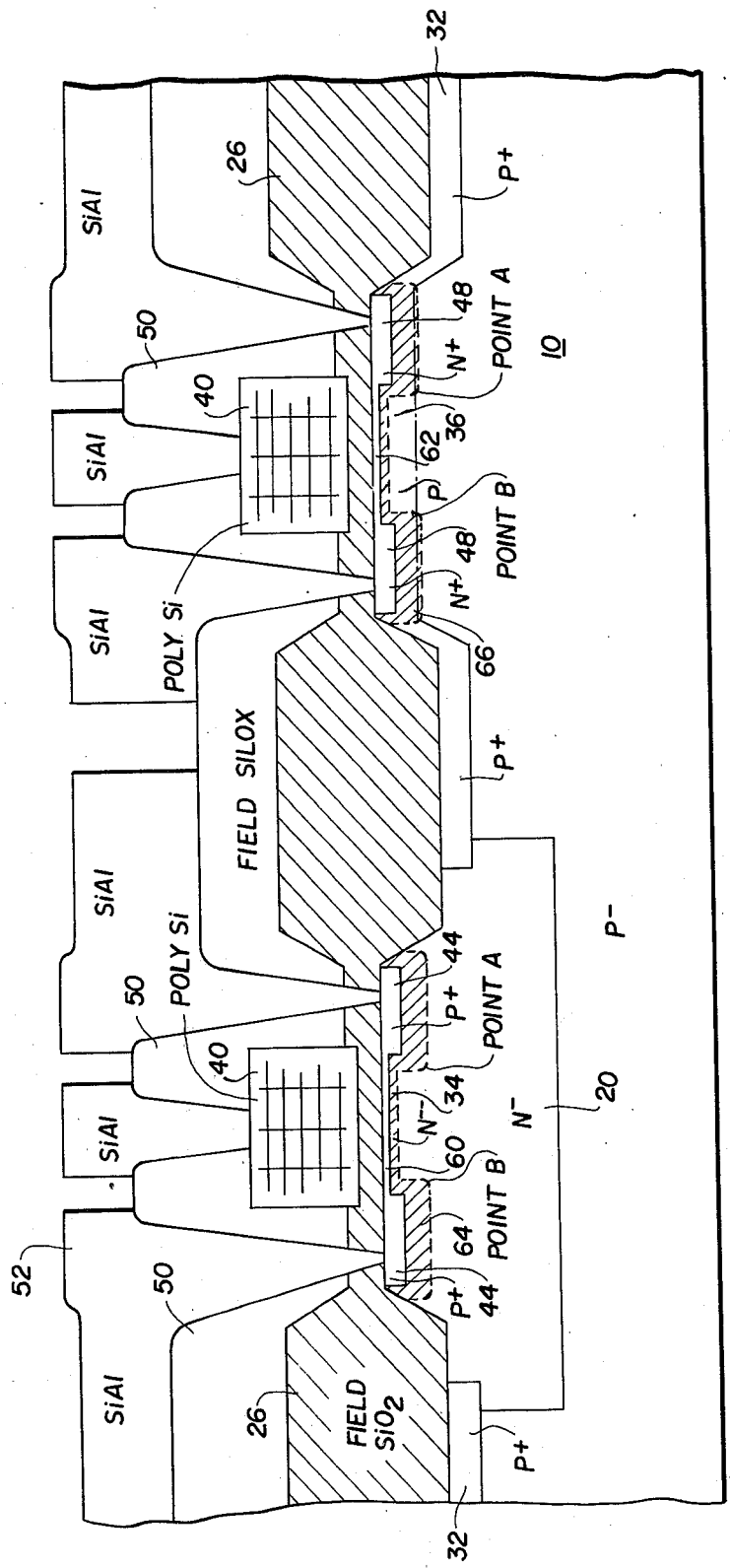
FIG. 11 is a cross-sectional view of a substrate illustrating the resulting CMOS devices having short channels fabricated therein according to the principles of the present invention.

The above described process may be used for fabricating N and P channel devices with channel lengths down to the micron and submicron range by proper adjustment of the N− well impurity implant and the channel adjust doping implant. In the operation of an MOS transistor, the biasing causes the surface region of the channel to invert to create a conductive path between the source and drain regions. This is illustrated in FIG. 11 with inverted P channel 60 and inverted N channel 62. In addition to the inverted channel regions, a reverse bias depletion region forms about the source, drain, and channel in the body. This is illustrated in the cross-hatched regions 64 and 66 for the P and N channel MOS devices, respectively. Punchthrough occurs when points A and B of the drain and source depletion regions touch. This results in a high electric field across points A and B and current will flow therebetween. To prevent punchthrough, the impurity concentration of the channel region must be increased.

For the P channel device, the impurity concentration to form N− well 20 is increased in order to prevent punchthrough. The impurity concentration for the surface region of the N− well 20 should be in the range of $1 \times 10^{15}$ to $3 \times 10^{16}$ carriers per cubic centimeters. Since the impurity concentration of the N− well 20 is increased, the dose of the ion implant for the channel-adjust step which creates N− region 34 must also be increased to produce the desired threshold voltage for the P channel MOS device. It should be noted that the depth or the distance from the surface of the N−− region should be as short as possible so as to minimize the amount of the channel region of the N− well which has its concentration reduced so as to minimize the possibility of punchthrough.

Figure 6:
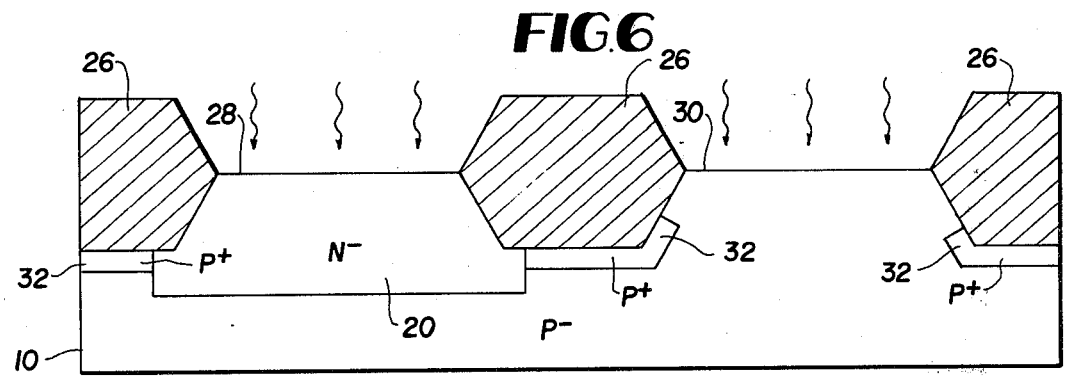

For the N channel device, the channel adjusting ion implant not only determines the threshold voltage of the N channel MOS device, but also prevents punchthrough since it increases the impurity concentration of the P− substrate. As illustrated specifically in FIG. 11, the P region 36 extends down from the surface below the depth of the source and drain regions 48. The P region 36 not only determines the threshold value of the N channel MOS device but also prevents punchthrough. As discussed previously, the boron or P impurity implant illustrated in FIG. 6 may be a single implant to modify the channel regions thereby determining the threshold value of the P channel and N channel MOS devices and to prevent punchthrough of the P channel device. Alternatively, two separate P impurity implant steps may be used, one for the N channel device and one for the P channel device. Thus, it is evident that the process described above is capable of forming CMOS devices of any channel length even in the submicron range. This process requires no additional steps and only requires modification of the impurity levels of the N− well 20 and the P impurity levels introduced during the channel-adjust doping step.

From the preceding description of the preferred embodiment, it is evident that the objects of the invention are attained and although the invention has been described and illustrated in detail, it is to be clearly understood that the same is by way of illustration and example only and is not to be taken by way of limitation. The spirit and scope of this invention are to be limited only by the terms of the appended claims.

What is claimed:

1. A method of fabricating complementary insulated gate field effect transistors in a P conductivity type substrate having a P conductivity type impurity concentration of $1 \times 10^{14}$ to $5 \times 10^{15}$ carriers per cubic centimeter comprising:

forming a first masking layer over said substrate with a first opening to define the surface area of a P channel device;

introducing N impurities into said substrate through said first opening to form an N conductivity type well region in said substrate having a surface N conductivity type impurity concentration of $1 \times 10^{15}$ to $3 \times 10^{16}$ carriers per cubic centimeter;

removing said first masking layer;

forming an oxide inhibiting second masking layer over regions in which the source, drain and channel of the transistors are to be formed;

forming a third masking layer on said second masking layer and said substrate over only said well region;

introducing P impurities into said substrate to form a P conductivity type guard ring of a greater impurity concentration than said substrate in said substrate except at said well region and the N channel transistor region of said substrate;

removing said third masking layer;

oxidizing said substrate to form a thick oxide layer on said substrate except on said transistor regions as defined by said second masking layer;

removing said second masking layer to expose said transistor regions; and forming said transistors in said exposed transistor regions.

2. The method according to claim 1 wherein said oxidizing forms said thick oxide layer penetrating into said substrate less than the depth of said well region and displaces said guard ring from the surface of said transistor regions.

3. The method according to claim 2 wherein forming said transistors includes introducing impurities into said transistor regions to form source and drain regions, said source and drain regions having a depth less than the depth of penetration of said thick oxide layer.

4. The method according to claim 3 wherein forming said transistors includes forming a thin insulative layer over said transistor regions, forming a layer of gate material over said insulative layer, removing portions of said insulative layer and said gate layer to define a gate structure, and said impurities are introduced into said openings using said gate structure as an alignment mask.

5. The method according to claim 1 including initially forming a thin oxide layer on the substrate and forming said first opening in said thin oxide layer.

6. The method according to claim 5 wherein said thin oxide layer is sufficiently thick to form a mask with said second masking layer to prevent introduction of said P conductivity type impurities into said N channel transistor region not covered by said third masking layer.

7. The method according to claim 5 wherein said first opening in said thin oxide layer is formed by applying, exposing and etching a layer of photosensitive resist material and said photosensitive resist material forming said first masking layer.

8. The method according to claim 5 wherein said thin oxide layer is formed to have a thickness in the range of 500 to 1000 angstroms.

9. The method according to claim 5 including removing any oxide over said transistor regions before forming said transistors in said transistor regions.

10. The method according to claim 9 wherein said oxide is removed by non-selective etching.

11. The method according to claim 1 wherein said first and third masking layers are photosensitive resist materials.

12. The method according to claim 1 including introducing P conductivity type impurities into the surface of said transistor regions before forming said transistors in said transistor regions.

13. A method of fabricating complementary insulated gate field effect transistors having a channel length in the micron range comprising:

introducing N type impurities into a P substrate to form an N conductivity type well region in said P substrate having an impurity concentration sufficient to prevent punchthrough for a desired P channel transistor;

introducing P type impurities into a P type region of said substrate to increase the impurity concentration of the surface of said P type region to determine the threshold voltage and prevent punchthrough for a desired N channel transistor;

introducing P type impurities into said N type well region to reduce the N type impurity concentration of the surface of said N type to determine the threshold voltage of said desired P channel device; and forming an N channel transistor in said P type region and a P channel transistor in said N type well.

14. The method according to claim 13 wherein said P type impurities introduction steps are performed simultaneously.

15. The method according to claim 13 wherein said substrate is selected to have a P conductivity type impurity concentration in the range of $1 \times 10^{14}$ to $5 \times 10^{15}$ carriers per cubic centimeter and said first mentioned P type impurity introduction step is performed to increase the surface impurity concentration in the range of $5 \times 10^{15}$ to $1 \times 10^{17}$ carriers per cubic centimeter.

16. The method according to claim 13 wherein said N type impurity introduction step is performed to form said N type well having an impurity concentration in the range of $1 \times 10^{15}$ to $3 \times 10^{16}$ carriers per cubic centimeter and said second mentioned P type impurity introduction step is performed to reduce the surface impurity concentration in the range of $-7 \times 10^{16}$ to $2.5 \times 10^{16}$ carriers per cubic centimeter.

* * * * *